United States Patent

Schmitt

[19]

[11] Patent Number: 6,115,250
[45] Date of Patent: *Sep. 5, 2000

[54] COMPUTER AND AN ASSEMBLY AND METHOD FOR COOLING A COMPUTER

[75] Inventor: Ty Schmitt, Round Rock, Tex.

[73] Assignee: Dell USA, LP, Round Rock, Tex.

[*] Notice: This patent is subject to a terminal disclaimer.

[21] Appl. No.: 09/009,281

[22] Filed: Jan. 20, 1998

[51] Int. Cl.$^7$ ....................................................... H05K 7/20
[52] U.S. Cl. .......................... 361/695; 361/685; 361/692; 361/687; 361/727; 165/104.34; 312/298
[58] Field of Search ..................................... 361/683–687, 361/721–724, 727, 688, 692–695; 165/104.34, 101, 185; 312/298, 350, 138.1; 340/635; 369/75.1; 454/186; 415/213.1, 214.1; 416/247 R

[56] References Cited

U.S. PATENT DOCUMENTS

| | | | |
|---|---|---|---|
| 4,931,904 | 6/1990 | Yiu | 361/695 |
| 5,208,730 | 5/1993 | Tracy | 361/384 |
| 5,617,572 | 4/1997 | Pearce et al. | |
| 5,625,227 | 4/1997 | Estes et al. | |
| 5,713,790 | 2/1998 | Lin | 454/184 |
| 5,793,608 | 8/1998 | Winick et al. | 361/695 |
| 5,793,610 | 8/1998 | Schmitt | 361/695 |

OTHER PUBLICATIONS

U.S. Patent application No. 08/374,266, filed on Jan. 18, 1995, Mills, Plenum Bypass Serial Fan Cooling Substystem For Computer Systems, Abstract, 2 sheet of drawings, and filing receipt.

U.S. Patent application No. 08/644,582, filed on May 10, 1996, Jeffries et al., Heat Dissipator With Multiple Thermal Cooling Paths, Abstract, 2 sheets of drawings, and filing receipt.

U.S. Patent application No. 08/754,965, filed Nov. 22, 1996, Estes et al., Circuit Board–Mounted IC Package Cooling Apparatus and Methods, Abstract, 1 sheet of drawings, and filing receipt.

U.S. Patent application No. 08/889,287, filed Jul. 8, 1997, Moss et al., Computer With Docking Station for Docking and Cooling the Computer, Abstract, 4 sheets of drawings, and filing receipt.

*Primary Examiner*—Leo P. Picard
*Assistant Examiner*—Michael Datskovsky
*Attorney, Agent, or Firm*—Haynes and Boone, L.L.P.

[57] ABSTRACT

A computer, or other similar type of electronic component, in which a plurality of components are disposed in a chassis. A fan assembly is mounted in the chassis for forcing air through the chassis. The fan and the chassis are provided with one or more mounting members for permitting the fan to be installed in the chassis in a manner to establish an air flow in the chassis in a predetermined direction. The mounting members prevent the installation of the fan in the chassis in a manner to establish air flow in a direction opposite the predetermined direction.

36 Claims, 3 Drawing Sheets

COMPUTER AND AN ASSEMBLY AND METHOD FOR COOLING A COMPUTER

TECHNICAL FIELD

The present disclosure relates, in general, to a computer, or other similar electronic component, and, more particularly, to such a component and method according to which an internal fan assembly is provided for cooling the interior of the computer.

BACKGROUND

As computers, such as central processing units, servers, and other similar types of electronic components grow in speed and shrink in size, power consumed within the system per unit volume (power density) increases dramatically. Thus, it becomes essential to dissipate the heat generated by components within the system during operation to ensure that the components remain within their normal operating temperature ranges since, otherwise, the components will fail immediately or will have too short a lifetime.

One of the most effective techniques of dissipating heat from a computer, or a similar type of electronic component, is to provide an internal fan, or fan assembly, to directly apply a relatively high-velocity air across the surface of the internal components to force cool the components. This raises the convective heat transfer coefficient for the surface of the internal components, thereby increasing the convection cooling.

Although a fan-based system provides effective component cooling, it has draw-backs. For example, if the fan fails or locks up, there is no way to cool the components of the computer because there is usually no back-up capability. Thus, the components may overheat causing them to malfunction and the computer to fail. A viable solution in this regard is to incorporate a secondary, or redundant, fan to protect the component from overheating should the primary fan fail. The redundant fan is usually designed to run continuously with the primary fan while the components are in operation since it has the advantage of offering additional cooling while simultaneously fulfilling the ultimate objective for implementing the other fan.

However, in these arrangements, the mounting of the fans to the chassis of the component is difficult and time-consuming largely due to the small amount of area in the chassis available to receive the fans. Also, it is difficult to insure that the fans are installed in the proper orientation in the chassis to insure proper air flow. Further, if the redundant fan fails, air will tend to backflow through it, thus disrupting the flow pattern through the remaining, operable fan(s).

Accordingly, what is needed is a computer, or other similar type of electronic component, incorporating an internal fan assembly for cooling the interior of the computer, with the fan assembly being easily and quickly installed in the chassis of the computer in a particular orientation to insure proper air flow.

SUMMARY

To this end, according to an embodiment of the invention, a computer, or other similar type of electronic component, is provided in which a fan or fan assembly is mounted in the chassis of the computer for forcing air through the chassis. The fan and the chassis are provided with one or more mounting members for permitting the fan to be installed in the chassis in a manner to establish an air flow in the chassis in a predetermined direction. The mounting members prevent the installation of the fan in the chassis in a manner to establish air flow in a direction opposite the predetermined direction.

Significant features are achieved with the above embodiment since the fan assembly is easily and quickly installed in the chassis of the computer in a particular orientation relative to the components in the chassis to insure proper air flow. Also, the fan assembly can be easily and quickly removed from the chassis for repair or replacement.

DETAILED DESCRIPTION OF THE PREFERRED EMBODIMENT

Figure 1:
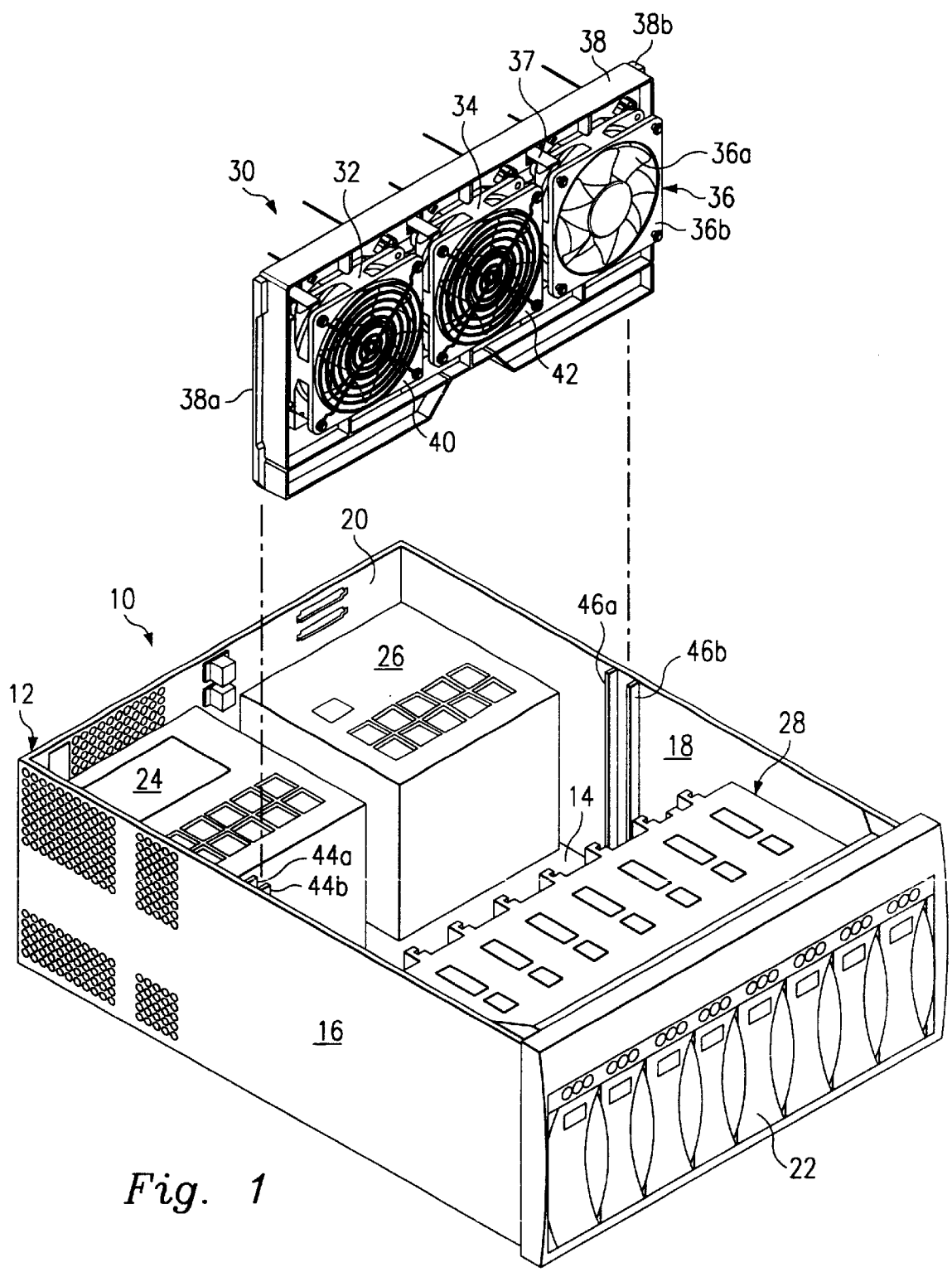
FIG. 1 is a isometric, partially exploded, view of a computer and fan assembly according to an embodiment of the present invention.

FIG. 1 of the drawings depicts a computer 10 according to an embodiment of the present disclosure which, for the purpose of example, is shown in the form of a conventional file server for use in a computer network. The server 10 includes a chassis 12 formed by a bottom plate 14, a pair of side walls 16 and 18, and a pair of end walls 20 and 22.

A pair of power supplies 24 and 26 are housed within the chassis 12 and are secured in the chassis in any known manner. A bank of hard drives shown, in general, by the reference numeral 28, is also secured in the chassis 12 in a spaced relation to the power supplies 24 and 26. Since the power supplies 24 and 26, as well as the bank 28 of hard drives, are conventional, they will not be described in detail. It is understood that additional components, buses, electrical traces, electrical circuits and related devices (not shown) are provided in the chassis 10 but are not shown in the interest of clarity.

A fan assembly 30 is provided and is shown in FIG. 1 in a position spaced above the chassis 12 and oriented for installation in the chassis. In its assembled condition in the chassis 12, the fan assembly 30 is mounted relative to the two side walls 16 and 18 of the chassis in a manner to be described and extends between the hard drive bank 28 and the power supplies 24 and 26.

The fan assembly 30 includes three fans 32, 34, and 36 mounted to a subchassis 38 for drawing air from the portion of the chassis 12 containing the hard drive bank 28 and forcing it to and across the power supplies 24 and 26 for cooling the bank and the power supplies. Two finger guards 40 and 42 are shown mounted over the inlet ends of the fans 32 and 34, respectively. It is understood that a finger guard identical to the finger guards 40 and 42 is also mounted over the fan 36 but has been omitted from the drawings so that the latter fan can be better described as follows.

The fan 36 includes a propeller blade 36a, a motor (not shown) for driving the blade, and a open-ended housing 36b containing the motor and the blade. A flexible tab 37 extends from the subchassis 38 and engages the fan housing 36b to secure the housing 36b to the subchassis 38. Since the fan 36 is conventional, and since the other fans 32 and 34 are identical to the fan 36 and are installed in the subchassis 38 in the same manner, they will not be described in detail.

A pair of mounting flanges 38a and 38b extend from the respective ends of the subchassis 38. The flange 38a extends for the length of a side wall of the subchassis 38 and is adapted to extend between a pair of parallel, mounting rails 44a and 44b mounted to the inner surface of the sidewall 16. The mounting rails 44a and 44b are spaced apart a distance slightly greater that the width of the flange 38a so as to receive the flange with minimal clearance. Similarly, the flange 38b is mounted on the other sidewall of the chassis 12 and is adapted to extend, with minimal clearance, between a pair of parallel, mounting rails 46a and 46b mounted to the inner surface of the side wall 18.

To insert the fan assembly 30 to the chassis 12, the fan assembly is simply aligned relative to, and lowered towards, the chassis from the position shown in FIG. 1 until the flange 38a extends between the rails 44a and 44b and the flange 38b extends between the rails 46a and 46b. The assembly 30 is then lowered further until it rests on the upper surface of the bottom plate 14. The height of the assembly 30 is such that its upper surface is engaged by the cover, or top plate (not shown), of the chassis 12 when the latter plate is installed over the chassis during final assembly to secure the assembly in the chassis.

According to a feature of the present invention, the width of the mounting flange 38b, and the corresponding space between the mounting rails 46a and 46b, are greater than the width of the mounting flange 38a and the space between the mounting rails 44a and 44b. This prevents the flange 38b from being inserted in the space between the rails 44a and 44b, and thus insures that the subchassis 38, and therefore the fans 32, 34 and 36 will be oriented properly relative to the chassis 12.

As stated above, when the fan assembly 30 is installed in the chassis 12, the fans 32, 34 and 36 are designed to pull air from that portion of the chassis 12 containing the hard drive bank 28 and force the air into that portion of the chassis containing the power supplies 24 and 26. This raises the convective heat transfer coefficient for the surface of the power supplies 24 and 26 and the hard drive bank 28, thereby increasing their convection cooling.

Figure 2:
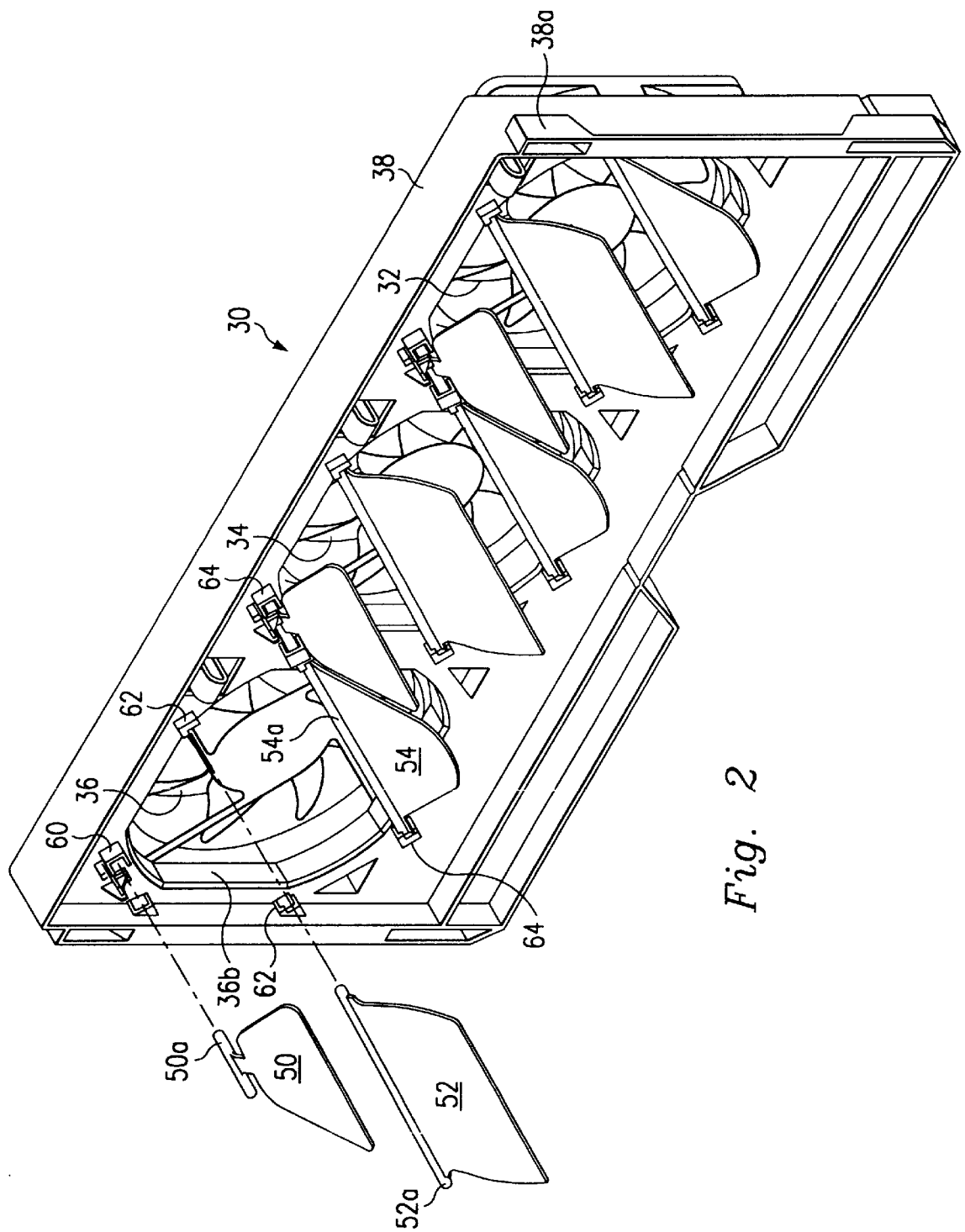
FIG. 2 is an isometric view of the fan assembly of FIGS. 1 and 2.

As shown in FIG. 2, a series of horizontally-extending, vertically-spaced, louvers are associated with the outlet end of each of the fans 32, 34 and 36. With reference to the fan 36 as an example seven louvers are mounted to the outlet end of the subchassis 38 and in the path of air flow through the fan 32 with three louvers being referred to by the reference numbers 50, 52 and 54, respectively. For the convenience of presentation, the louvers 50 and 52 are shown slightly spaced from the subchassis 38, and the louver 54 is shown mounted to the subchassis.

In order to mount the louvers 50, 52, and 54 to the subchassis 38, three horizontally extending shafts 50a, 52a, and 54a are disposed along the rear edges of the louvers 50, 52 and 54 and preferably are formed integrally with the louvers. Also, three pairs of support brackets 60, 62, and 64 are mounted to the subchassis 38, with one bracket of each pair being mounted to the subchassis in a spaced relation to the other bracket of the pair. The distance between the brackets in each pair of brackets 60, 62, and 64 substantially corresponds to the length of their corresponding shafts 50a, 52a, and 54a, and the respective end portions of the shafts 50a, 52a, and 54a are mounted in the pairs of brackets, 60, 62 and 64, respectively, in a loose fit. As a result the shafts 50a, 52a, and 54a can rotate relative to the brackets 60, 62 and 64, respective to cause pivotal movement of the louvers 50, 52, and 54 relative to the subchassis 38 and to the fan 32. It is noted that the louvers 50, 52, and 54, along with their respective shafts 50a, 52a, and 54a, are symmetrical, thus enabling either end of each shaft to be inserted into either one of the corresponding pairs of support brackets 60, 62, and 64 to facilitate assembly.

The support brackets 60, 62 and 64 are located on the subchassis 38 in a manner so that the shafts 50a, 52a, and 54a, and therefore their respective louvers 50, 52 and 54, extend at an angle to the longitudinal axis of the subchassis 38. As a result the louvers 50, 52 and 54 will operate when the longitudinal axis of the subchassis 38 extends horizontally as shown in FIGS. 1 and 2, or when it extends vertically as will be described.

When the fan 36 is inoperable, the gravitational forces caused by the weight of the louvers 50, 52 and 54, apply a torque, or rotational force, to the shafts 50a, 52a and 54a, respectively, causing the louvers to pivot to a closed position thus blocking the flow of air through the fan 36. When the fan 36 is activated, the resulting air pressure created by the fan is sufficient to force the louvers 50, 52, and 54 to their open position as shown in FIG. 2.

The remaining louvers associated with the fan 36 and all of the louvers associated with each of the fans 32 and 34 are identical to the louvers 50, 52 and 54, respectively, are mounted to the subchassis 38 in the same manner as the latter louvers, and function in a manner identical to that of the louvers 50, 52, and 54. Therefore, the remaining louvers associated with the fan 36 and the louvers associated with the fans 32 and 34 will not be described in any further detail.

Figure 3:
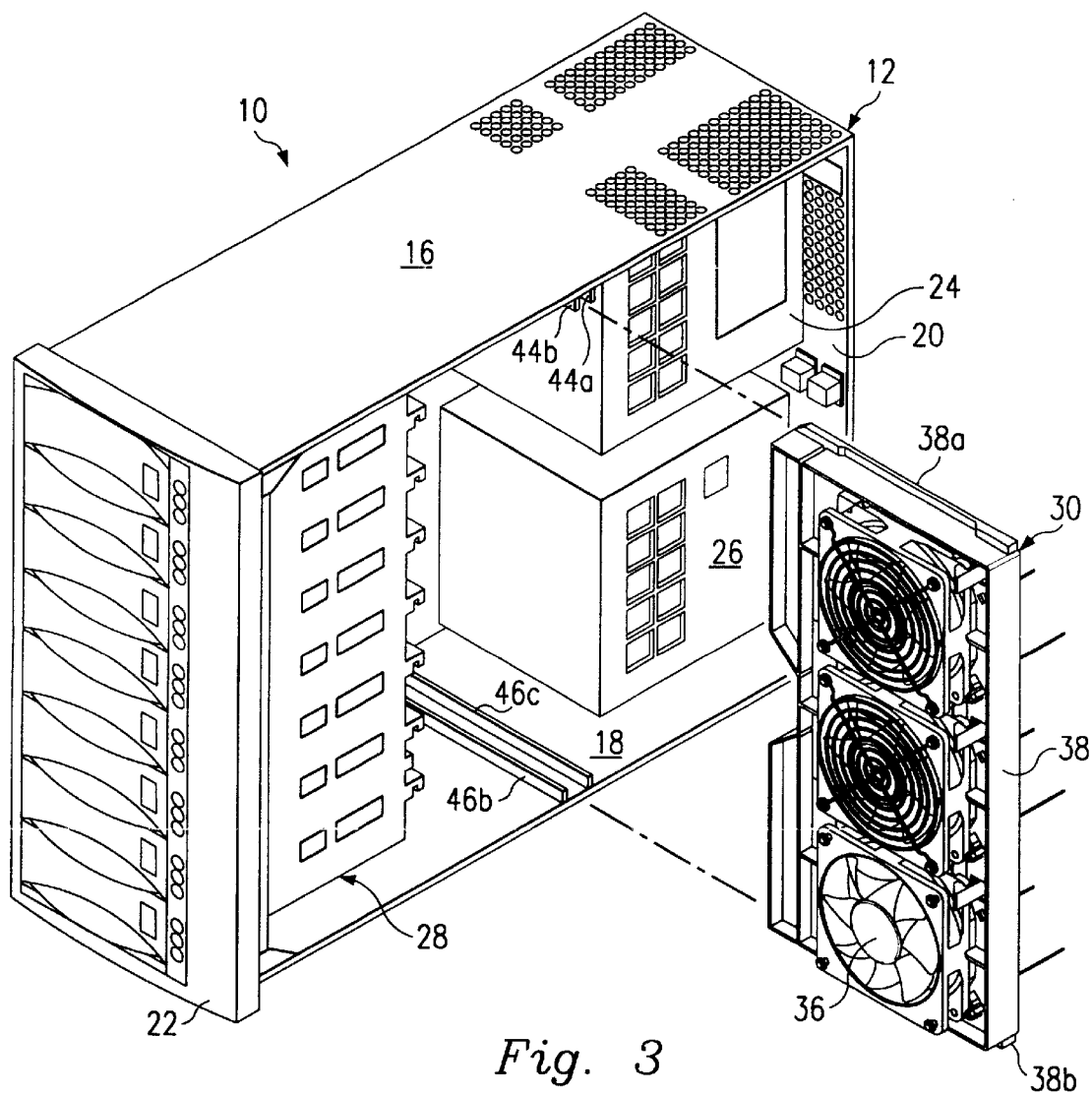
FIG. 3 is view similar to FIG. 1, but depicting a different orientation of the computer and fan assembly of FIG. 1.

FIG. 3 is a view similar to that of FIG. 1 but depicts the computer 10, including the fan assembly 30, in a vertical orientation, or "tower" configuration. In this mode, since the louvers 50, 52 and 54 associated with the fan 36, as well as the louvers associated with the fans 32 and 34, extend at an angle to the longitudinal axis of the subchassis, they will operate in the same manner as described above.

In operation, the fan assembly 30 is inserted in the chassis 12 by aligning the assembly in a spaced relation to the chassis as shown in FIGS. 1 and 2. The assembly 30 is then moved towards the chassis 12 until the mounting flange 38a extends between the mounting rails 44a and 44b and the mounting flange 38b extends between the mounting rails 46a and 46b. The assembly 30 is then moved further into the chassis 12 until the leading surface of the subchassis 38 rests on the corresponding surface of the bottom plate 14. The cover, or top plate (not shown), of the chassis 12 is then installed over the chassis, and the height of the subchassis 38 is such that the top plate engages the corresponding surface of the subchassis to secure the assembly in the chassis.

The fans 32, 34 and 36 are not operable when the computer 10 is not in use, in which case the louvers 50, 52 and 54 of the fan 36, and the corresponding louvers associated with the fans 32 and 34, pivot to their closed positions in response to the gravitational forces acting on the louvers. When the computer 10 is turned on, the fans 32, 34 and 36 are activated which draws air from the area in the chassis 12 housing the bank 28 of hard drives (FIGS. 1 and 3) and forces it through the fans 32, 34 and 36 and towards the power supplies 24 and 26. This air flow through the fans 32, 34, and 36 pivots the louvers 50, 52 and 54 of the fan 36, and the corresponding louvers associated with the fans 34 and 36, to their horizontal, open positions. Thus, a continuous air flow is achieved which increases the convective cooling of the hard drive bank 28 and the power supplies 24 and 26.

If, for example, the fan 36 should fail, the louvers 50, 52, and 54 will pivot to their closed position under the force of gravity which blocks any backflow of air through the fan 36 that may occur if the louvers 50, 52, and 54 were open. This prevention of any backflow of air through the fan 36 eliminates any interference with the normal air flow through the functioning fans 32 and 34. Of course, if the fans 32 and/or 34 should fail, air flow would be prevented by their respective louvers in the same manner.

If any of the fans 32, 34, and 36 need to be serviced or replaced, the assembly 30 is easily removed from the chassis 12 by simple removing the top plate, or cover, of the chassis and sliding the assembly out of the chassis.

As a result of the foregoing, a distinct advantage is obtained by the system and method of the present disclosure since the fan assembly can be easily installed and removed from the chassis in a manner to insure that the fans will be properly oriented in the chassis. Also, a single fan failure does not unduly compromise air exchange or directionality of air flow through the other fans.

It is understood that variations may be made in the foregoing without departing from the scope of the present disclosure. For example, mounting and guiding members other that the flanges 38a and 38b and the rails 44a, 44b, 46a and 46b can be employed as long as the function of the latter flanges and rails is achieved. Also, the flanges 38a and 38b can be mounted on the side walls 16 and 18 and the rails 44a, 44b, 46a and 46b can be mounted on the subchassis 38. Further, the number of louvers associated with each fan and the number of fans employed in the fan assembly can be varied within the scope of the disclosure. Also, it is understood that the fan assembly 30 can be oriented in the chassis 12 so that it pulls air from the area of the chassis 12 housing the power supplies 24 and 26 towards the area of the chassis housing the hard drive bank 28. Further, only one fan can be employed if it is desired to block air flow through the fan in the above manner under certain conditions. It is also understood that the term "computer" is used in its broadest sense and is meant to include all types of computing systems including, but not limited to, laptop computers, central process units, towers, file servers, etc. Further, the present invention is not limited to computers, but is equally applicable to other electronic components that generate heat during use.

Other modifications, changes and substitutions are intended in the foregoing disclosure and in some instances some features of the disclosure will be employed without a corresponding use of other features. Accordingly, it is appropriate that the appended claims be construed broadly and in a manner consistent with the scope of the disclosure.

What is claimed is:

1. A computer comprising at least one chassis assembly, a plurality of components disposed in the chassis assembly, at least one fan assembly disposed in the chassis assembly, at least one flange disposed on one of the assemblies, and at least one pair of guide rails disposed on the other assembly for receiving the flange to permit the fan assembly to be installed in the chassis assembly to establish an air flow in the chassis assembly in a predetermined direction, the flange and the guide rails preventing the installation of the fan assembly in the chassis assembly in a manner to establish air flow in a direction opposite the predetermined direction.

2. The computer of claim 1 wherein there are two flanges disposed on the fan assembly and two pairs of guide rails disposed on the chassis assembly for respectively receiving the flanges.

3. The computer of claim 1 wherein the width of the one of the flanges is greater that the width of the other flange, and wherein the space between the guide rails of one pair is greater than the space between the guide rails of the other pair.

4. The computer of claim 1 wherein the fan assembly comprises a subchassis and a fan mounted on the subchassis.

5. The computer of claim 4 wherein there are two flanges disposed on the subchassis and two pairs of guide rails disposed on the chassis assembly for respectively receiving the flanges.

6. The computer of claim 5 wherein the width of the one of the flanges is greater that the width of the other flange, and wherein the space between the guide rails of one pair is greater than the space between the guide rails of the other pair.

7. The computer of claim 4 further comprising at least one louver pivotally mounted to the subchassis for movement between a horizontal open position in which it permits air flow through the subchassis to distribute air over at least one of the components, and a vertical closed position in which it blocks air flow through the subchassis.

8. The computer of claim 7 wherein the louver is pivotally attached to the subchassis and pivots to the closed position under the force of gravity and to the open position in response to the air pressure established by the fan.

9. The computer of claim 8 wherein the louver extends at an angle to the subchassis so that the louver will pivot to the closed position when the subchassis is oriented in a first plane or in a second plane perpendicular to the first plane.

10. The computer of claim 7 further comprising at least one horizontally extending shaft connected to the louver and adapted for rotational movement relative to the subchassis in response to the movement of the louver.

11. The computer of claim 10 wherein the louver moves to the closed position under the force of gravity and to the open position in response to the air pressure established by the fan, the movement causing corresponding rotational movement of the shaft.

12. The computer of claim 10 further comprising a pair of spaced support brackets attached to the subchassis for receiving the respective ends of the shaft, wherein a longitudinal edge of the louver is attached to the shaft along a portion of the shaft extending parallel to the axis of the shaft so that either end of the shaft can be mounted in either of the support brackets.

13. The computer of claim 7 wherein there are a plurality of louvers pivotally mounted to the subchassis and extending parallel to each other.

14. The computer of claim 7 wherein there are at least two fans and at least two louvers respectively associated with the at least two fans, and wherein, upon failure of one fan, the louver associated with the one fan blocks the flow of air through the one fan so that it will not interfere with the flow of air through the other fan.

15. A cooling system for an electronic component having a first chassis housing a plurality of components; the cooling system comprising a second chassis, a fan mounted on the second chassis, at least one flange disposed on one of the chassis, and at least one pair of guide rails disposed on the other chassis and adapted to receive the flange to install the second chassis to the first chassis to establish an air flow in the first chassis in a predetermined direction, the flange and the guide rails preventing the installation of the second chassis in the first chassis in a manner to establish air flow in a direction opposite the predetermined direction.

16. The system of claim 1 wherein there are two flanges disposed on the second chassis and two pairs of guide rails disposed on the first chassis for respectively receiving the flanges.

17. The system of claim 16 wherein the width of the one of the flanges is greater that the width of the other flange, and wherein the space between the guide rails of one pair is greater than the space between the guide rails of the other pair.

18. A computer comprising a first chassis, a plurality of components disposed in the first chassis, a second chassis, at least one fan disposed in the second chassis, at least one flange disposed on one of the chassis, and at least one pair of guide rails disposed on the other chassis, the flange engaging the guide rails to mount the second chassis in the first chassis in a manner to establish an air flow in the first chassis in a predetermined direction, the mounting members preventing the installation of the second chassis in the first chassis in a manner to establish air flow in a direction opposite the predetermined direction.

19. The computer of claim 18 wherein there are two flanges disposed on the second chassis and two pairs of guide rails disposed on the first chassis for respectively receiving the flanges.

20. The computer of claim 19 wherein each chassis has two opposed walls, wherein the two flanges are respectively mounted on the opposed walls of the second chassis, and wherein the two pairs of guide rails are respectively mounted on the opposed walls of the first chassis.

21. The computer of claim 20 wherein the width of the one of the flanges is greater that the width of the other flange, and wherein the space between the guide rails of one pair is greater than the space between the guide rails of the other pair.

22. The computer of claim 20 wherein the width of the one of the flanges is greater that the width of the other flange, and wherein the space between the guide rails of one pair is greater than the space between the guide rails of the other pair.

23. The computer of claim 18 further comprising at least one louver pivotally mounted to the second chassis for movement between a horizontal open position in which it permits air flow through the second chassis to distribute air over at least one of the components, and a vertical closed position in which it blocks air flow through the second chassis.

24. The computer of claim 23 wherein the louver is pivotally attached to the second chassis and pivots to the closed position under the force of gravity and to the open position in response to the air pressure established by the fan.

25. The computer of claim 24 wherein the louver extends at an angle to the second chassis so that the louver will pivot to the closed position when the second chassis is oriented in a first plane or in a second plane perpendicular to the first plane.

26. The computer of claim 23 further comprising at least one horizontally extending shaft connected to the louver and adapted for rotational movement relative to the second chassis in response to the movement of the louver.

27. The computer of claim 26 wherein the louver moves to the closed position under the force of gravity and to the open position in response to the air pressure established by the fan, the movement causing corresponding rotational movement of the shaft.

28. The computer of claim 26 further comprising a pair of spaced support brackets attached to the second chassis for receiving the respective ends of the shaft, wherein a longitudinal edge of the louver is attached to the shaft along a portion of the shaft extending parallel to the axis of the shaft so that either end of the shaft can be mounted in either of the support brackets.

29. The computer of claim 23 wherein there are a plurality of louvers pivotally mounted to the second chassis and extending parallel to each other.

30. The computer of claim 23 wherein there are at least two fans and at least two louvers respectively associated with the at least two fans, and wherein, upon failure of one fan, the louver associated with the one fan blocks the flow of air through the one fan so that it will not interfere with the flow of air through the other fan.

31. A cooling system for an electronic component having a chassis housing a plurality of components, the cooling system comprising a subchassis, at least one fan mounted on the subchassis, a flange mounted on one of the chassis, and a pair of spaced guide rails mounted on the other chassis, the flange adapted to engage the guide rails to mount the subchassis in the chassis to establish air flow in the chassis in a predetermined direction, the flange and the guide rails cooperating to prevent mounting of the subchassis in the chassis to establish air flow in a direction opposite the predetermined direction.

32. The system of claim 31 wherein there are two flanges disposed on the subchassis and two pairs of guide rails disposed on the chassis for respectively receiving the flanges.

33. The system of claim 31 wherein the width of the one of the flanges is greater that the width of the other flange, and wherein the space between the guide rails of one pair is greater than the space between the guide rails of the other pair.

34. A computer comprising a first chassis comprising two opposed walls, a plurality of components disposed in the first chassis, a second chassis having two opposed walls, at least one fan disposed in the second chassis, two mounting members respectively mounted on the opposed walls of one of the chassis, two mounting members respectively mounted on the opposed walls of the other chassis, the mounting members on the one chassis respectively engaging the mounting members on the other chassis to mount the second chassis in the first chassis in a manner to establish an air flow in the first chassis in a predetermined direction, the mounting members preventing the installation of the second chassis in the first chassis in a manner to establish air flow in a direction opposite the predetermined direction.

35. The computer of claim 34 wherein two of the mounting members are flanges mounted on the opposing walls of one of the chassis, and the other two mounting members are two pairs of spaced guide rails mounted on the opposed walls of the other chassis, the two flanges respectively extending in the two guide rails to mount the second chassis in the first chassis.

36. The computer of claim 34 wherein there are two flanges disposed on the second chassis and two pairs of guide rails disposed on the first chassis for respectively receiving the flanges.

* * * * *

UNITED STATES PATENT AND TRADEMARK OFFICE
CERTIFICATE OF CORRECTION

PATENT NO. : 6,115,250
DATED : September 5, 2000
INVENTOR(S) : Schmitt

It is certified that error appears in the above-identified patent and that said Letters Patent is hereby corrected as shown below:

<u>Column 7,</u>
Line 25, please delete the word "that" and insert therefor -- than --.
Lines 24-33, please delete Claim 22.
Line 34, through Column 8, line 59, please renumber Claims 23-36.

Signed and Sealed this

Eighth Day of October, 2002

Attest:

JAMES E. ROGAN
Attesting Officer  Director of the United States Patent and Trademark Office